(12) United States Patent
Knight et al.

(10) Patent No.: US 7,475,494 B1
(45) Date of Patent: Jan. 13, 2009

(54) HYBRID THERMAL MANAGEMENT SYSTEM

(75) Inventors: Paul A. Knight, Clarkston, WA (US); Carl Axel Ingemar Kabrell, Newman Lake, WA (US)

(73) Assignee: Isothermal Systems Research, Inc., Liberty Lake, WA (US)

( * ) Notice: Subject to any disclaimer, the term of this patent is extended or adjusted under 35 U.S.C. 154(b) by 336 days.

(21) Appl. No.: 11/036,972

(22) Filed: Jan. 14, 2005

Related U.S. Application Data

(63) Continuation-in-part of application No. 10/648,774, filed on Aug. 25, 2003, now Pat. No. 7,150,109.

(51) Int. Cl.
*F26B 19/00* (2006.01)
*H02B 1/56* (2006.01)
*H05K 7/20* (2006.01)

(52) U.S. Cl. ............... 34/62; 34/66; 34/209; 454/184; 361/678; 361/690; 361/695; 361/698

(58) Field of Classification Search .......... 34/428, 34/62, 66, 209; 361/676–678, 688–691, 361/695, 698–699; 454/184
See application file for complete search history.

(56) References Cited

U.S. PATENT DOCUMENTS

| | | | | |
|---|---|---|---|---|
| 3,317,798 A | * | 5/1967 | Chu et al. | 361/696 |
| 5,181,648 A | * | 1/1993 | Leicht | 228/201 |
| 5,943,211 A | * | 8/1999 | Havey et al. | 361/699 |
| 6,597,569 B1 | * | 7/2003 | Unrein | 361/687 |
| 7,014,174 B2 | * | 3/2006 | Roberts et al. | 261/29 |
| 7,043,933 B1 | * | 5/2006 | Knight | 62/259.2 |
| 7,150,109 B2 | * | 12/2006 | Knight et al. | 34/62 |
| 7,180,741 B1 | * | 2/2007 | Knight et al. | 361/699 |

OTHER PUBLICATIONS

Parker Advanced Liquid Cooling System Team, Parker Aerospace, May 13, 2003, 29 Pages.
Minco/Omnetics Flex-Circuit Interconnect Solutions, Minco, Date Unknown, 1 Page.

* cited by examiner

*Primary Examiner*—Jiping Lu
(74) *Attorney, Agent, or Firm*—Michael S. Neustel

(57) ABSTRACT

A hybrid thermal management system for providing simultaneous spray cooling and dry cooling for a plurality of cards. The hybrid thermal management system includes a chassis having a global spray chamber, a hybrid chamber, a first opening within a rear portion of the chassis extending into the global spray chamber, a second opening within the rear portion of the chassis extending into the hybrid chamber, and a backplane secured and sealed to the rear portion of the chassis. A dry chamber may be attached to the chassis for air cooling electrical components. The cards within the global spray chamber are typically high heat flux components with increased cooling requirements and the cards in the hybrid chamber are comprised of dry/air cooling and zone cooling components.

23 Claims, 13 Drawing Sheets

HYBRID THERMAL MANAGEMENT SYSTEM

CROSS REFERENCE TO RELATED APPLICATIONS

I hereby claim benefit under Title 35, United States Code, Section 120 of U.S. patent application Ser. No. 10/648,774 filed Aug. 25, 2003 now U.S. Pat. No. 7,150,109. This application is a continuation-in-part of the 10/648,774 application. The 10/648,774 application is currently pending. The 10/648,774 application is hereby incorporated by reference into this application.

STATEMENT REGARDING FEDERALLY SPONSORED RESEARCH OR DEVELOPMENT

Not applicable to this application.

BACKGROUND OF THE INVENTION

1. Field of the Invention

The present invention relates generally to spray cool thermal management devices and more specifically it relates to a hybrid thermal management system for providing simultaneous global spray cooling and zone cooling for a plurality of electronic cards.

2. Description of the Related Art

The present invention relates to the thermal management of electronic components that are mounted upon electronic cards (a.k.a. expansion boards) or substrates. In a card level system, a plurality of cards are electrically connected within sockets upon a backplane (e.g. motherboard, etc.). Electronic cards are utilized in various applications such as personal computers, workstations, server computers, rack mounted services, network routers, network switches, telephone equipment (DWDMs, ADMs, TDMs, switches, repeaters and the like), and military applications (vehicle, aircraft, etc.). Examples of electronic cards include but are not limited to modems, video processors, network interfaces, processors, memory, hard drive controllers, hard drives, mouse controller, keyboard controller, global position systems, wireless cards, backplane controller cards and the like.

"Dry cooling" (i.e. air cooling) has been in usage for years for cooling electronic components. An example of a dry cooling system is a conventional desktop computer with a fan that passes air over the electronic components to cool the same. Dry cooling technology is acceptable for low powered electronic components. Dry cooling may also include standard conduction card cooling methods wherein a card creates a heat conduction path between one or more components to be cooled located on the card and a wall of a chassis.

Modern electronic devices have increased thermal management requirements. Conventional dry cooling technology simply is not capable of efficiently cooling modern high-end electronics. "Spray cooling" is being adopted today as the most efficient option for thermally managing electronic systems. U.S. Pat. No. 5,220,804 entitled High Heat Flux Evaporative Spray Cooling to Tilton et al. describes the earlier versions of spray cooling technology. U.S. Pat. No. 6,108,201 entitled Fluid Control Apparatus and Method for Spray Cooling to Tilton et al. also describes the usage of spray cooling technology to cool a printed circuit board. Spray cooling may be performed locally (i.e. where the chip is sprayed directly), globally (i.e. where the chip and surrounding electronics/boards are also sprayed), a combination of locally and globally, or in conjunction with air cooling or other cooling methods.

While there are many benefits in utilizing spray cooling technology, there are some detriments. One of the detriments with spray cooling technology is the relatively high cost of creating a spray cooling system capable of thermally managing all of the electronic devices, electronic cards and the like for an electronic system. Another problem with spray cooling technology is the potential increased weight of the thermal management unit. A further problem with spray cooling technology is that not all electronic devices are suitable for usage within a liquid coolant environment. Another problem with spray cooling technology is that to replace, repair or test any electronic device within a spray chassis the seal must be broken to the spray chassis thereby leading to the loss of coolant.

While these devices may be suitable for the particular purpose to which they address, they are not as suitable for providing simultaneous spray cooling and dry cooling for a plurality of cards sharing a common backplane, or backplane assembly. Conventional thermal management systems are suitable only for low or high heat flux applications with no thermal management system serving the need of being optimized for applications where some electronic devices may be cooled by global spray cooled, zone cooled and air cooled.

In these respects, the hybrid thermal management system according to the present invention substantially departs from the conventional concepts and designs of the prior art, and in so doing provides an apparatus primarily developed for the purpose of providing simultaneous spray cooling and dry cooling for a plurality of cards sharing a common backplane.

BRIEF SUMMARY OF THE INVENTION

In view of the foregoing disadvantages inherent in the known types of thermal management devices now present in the prior art, the present invention provides a new hybrid thermal management system construction wherein the same can be utilized for providing simultaneous spray cooling and dry cooling for a plurality of cards sharing a common backplane.

The general purpose of the present invention, which will be described subsequently in greater detail, is to provide a new hybrid thermal management system that has many of the advantages of the thermal management devices mentioned heretofore and many novel features that result in a new hybrid thermal management system which is not anticipated, rendered obvious, suggested, or even implied by any of the prior art thermal management devices, either alone or in any combination thereof.

To attain this, the present invention generally comprises a chassis having a hybrid chamber (e.g. for air cooling and/or zone cooling) and a global spray chamber, a first opening within a rear portion of the chassis extending into the global spray chamber, a second opening within the rear portion of the chassis extending into the hybrid chamber, and a backplane assembly secured and sealed to the rear portion of the chassis. Electronic cards may be electrically coupled within sockets of the backplane within both the hybrid chamber and the global spray chamber. The cards within the global spray chamber typically have a plurality of heat generating components that can be efficiently cooled with a wide area spray. The cards within the global spray chamber may also have components that contain high density electronics, having complex three-dimensional shapes that are not easily cooled by traditional means. The cards within the hybrid chamber may be either low power cards having components that can be cooled via conventional cooling methods (e.g. air or conduction cooling), or have high power cards having components that can efficiently be cooled via localized spray cooling methods. A single spray cooling system can provide the pressurized cooling fluid to both the global spray chamber as well as the hybrid chamber.

There has thus been outlined, rather broadly, the more important features of the invention in order that the detailed description thereof may be better understood, and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide a hybrid thermal management system that will overcome the shortcomings of the prior art devices.

A second object is to provide a hybrid thermal management system for providing simultaneous global spray cooling, zone cooling and/or dry cooling for a plurality of cards sharing a common backplane, or backplane assembly.

Another object is to provide a hybrid thermal management system that can provide environmental isolation to electronics.

Another object is to provide a hybrid thermal management system that is cost effective and efficient.

An additional object is to provide a hybrid thermal management system that has a reduce weight and size.

A further object is to provide a hybrid thermal management system that reduces the cost of electronic devices utilized by reducing the need for coolant tolerant specifications.

Another object is to provide a hybrid thermal management system that reduces coolant loss within a spray cooling system by reducing access to the global spray chamber.

A further object is to provide a hybrid thermal management system that effectively cools low heat flux and high heat flux electronic components.

Another object is to provide a hybrid thermal management system that utilizes a common backplane for electronic cards positioned within a hybrid chamber and a global spray chamber.

An additional object is to provide a hybrid thermal management system that increases system reliability and access.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

DETAILED DESCRIPTION OF THE INVENTION

A. Overview

Figure 1:
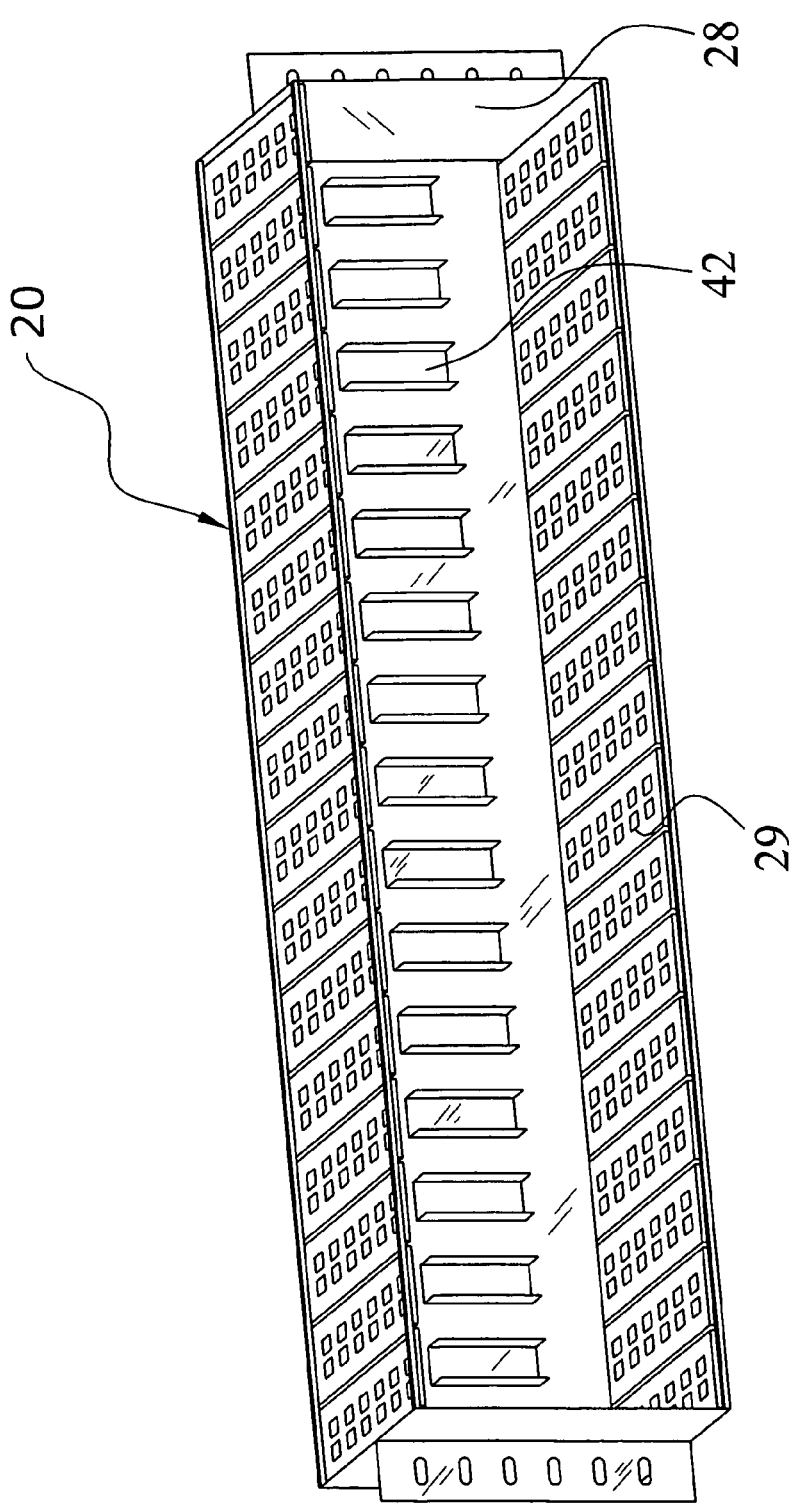
FIG. 1 is an upper perspective view of a prior art dry air cooling device.

Turning now descriptively to the drawings, in which similar reference characters denote similar elements throughout the several views, FIGS. 2 through 13 illustrate a hybrid thermal management system 10, which comprises a chassis 20 having a hybrid chamber 27 and a global spray chamber 26, a first opening 22 within a rear portion 21 of the chassis 20 extending into the global spray chamber 26, a second opening 24 within the rear portion 21 of the chassis 20 extending into the hybrid chamber 27 and a backplane 40 secured and sealed to the rear portion 21 of the chassis 20. Electronic cards 12 may be electrically coupled within sockets 42 of the backplane 40 within both the hybrid chamber 27 and the global spray chamber 26. The cards 12 within the global spray chamber 26 are typically high heat flux components with increased cooling requirements and the cards in the hybrid chamber 27 are comprised of dry/air cooling, zone cooling components, and/or conduction cooled components, such as but not limited to, network interface cards, I/O cards, hard drives, and flash drives. A spray cool system is within the global spray chamber 26, and a dry cool system and a zone cooling system are within the hybrid chamber 27.

B. Spray Cooling System

Figure 2:
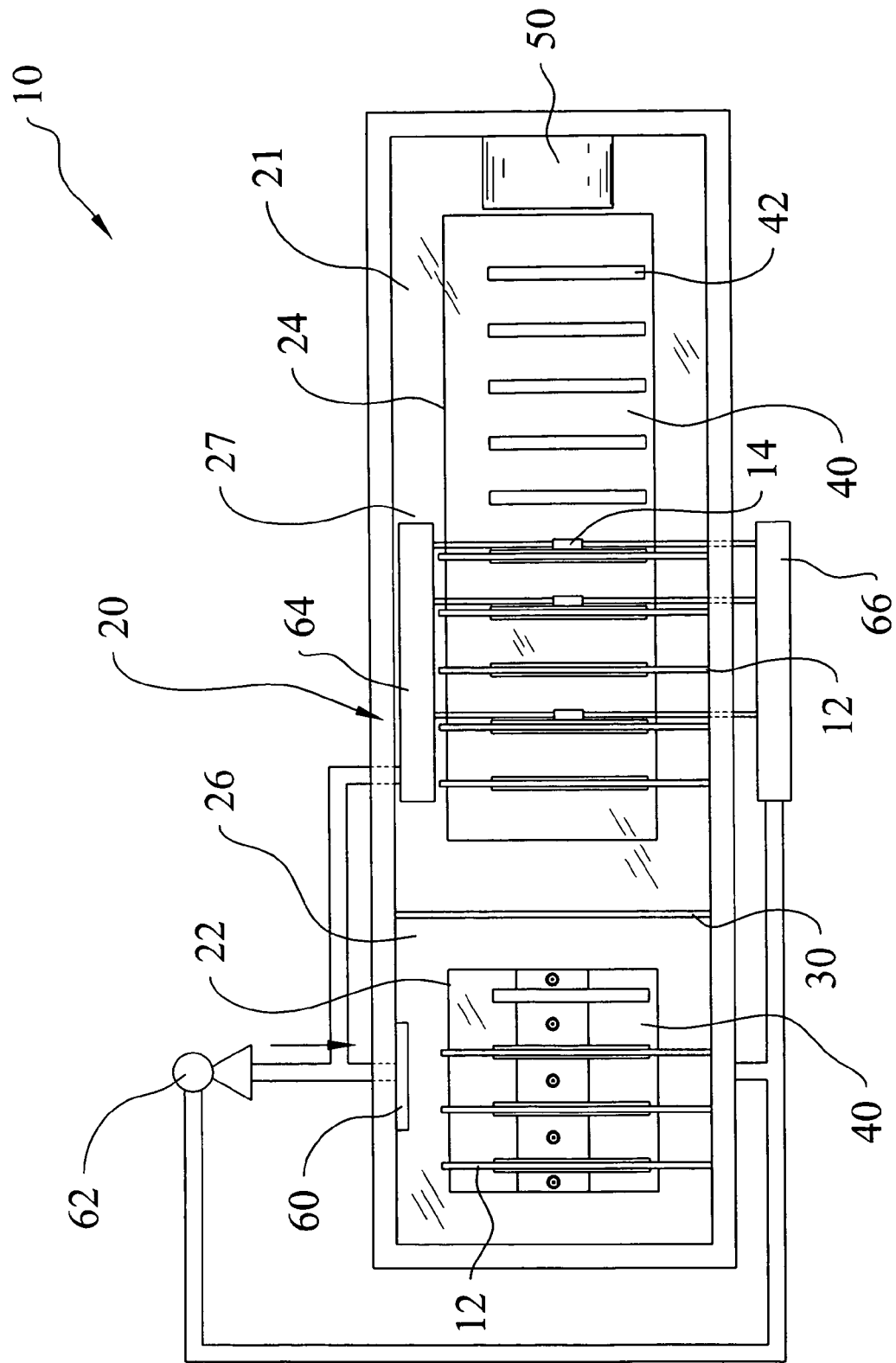
FIG. 2 is a front view of the present invention illustrating the global spray chamber and the hybrid chamber.

The global spray chamber 26 may use any conventional spray cooling system. A spray cooling system is typically comprised of a pump unit 62, filters, reservoir, and heat exchanger as shown in FIG. 2 of the drawings. The spray cooling system can be utilized to provide pressurized liquid coolant to both the global spray chamber 26 and the hybrid chamber for the zone coolers 14. Typical pump unit 62 output pressures are 10 to 30 psi and the fluid is dispensed to common button style pressure swirl atomizers in both chambers. Depending upon the required flow rates for localized heat transfer coefficients needed, atomizer center jet sizes can typically range from 0.005 to 0.02 in diameter.

In the global spray chamber 26, fluid is typically delivered to a manifold that houses spray units 60. For high heat flux components in the global spray chamber 26, fluid may also be brought from the manifold to localized spray modules via conventional tubing systems.

Similarly, in the hybrid chamber 27, fluid may be delivered to a supply manifold 64 that divides the fluid into tube systems that provide cooling fluid to the individual zone coolers 14. There are many different types of zone coolers 14 acceptable for use with the present invention. A preferred embodiment of zone coolers 14 may use top down spraying as described by U.S. Pat. No. 5,220,804, or side spray modules as described by U.S. Patent Application Publication No. 20030172669. Zone coolers 14 can also cool multiple components on a card, for example cooling one or more CPUs along with components such as FETS and memory within a single zone cooling structure. Such an apparatus is described by U.S. Pat. No. 5,719,444. In addition, zone coolers according to the present invention can use micro-channels, or mini-channels, such as described by U.S. Pat. No. 4,450,472. Zone coolers 14 may also be a forced convection cooler such as described by U.S. Pat. No. 6,616,907. The described embodiments of zone coolers 14 may be a cold plate version or provide direct liquid cooling. Generally, zone coolers 14 are a cooling solution used for cooling at the card and/or chip level. It is preferable that zone coolers 14 operate at a similar fluid pressure to spray units 60 within global spray chamber 26, so that a common pump system may be used.

After removing the heat from the processors and components, the surplus heat of the fluid is removed via a heat exchanger. The global spray chamber 26 may condense the fluid via condensation on the exterior walls of the chassis 20, or preferably, the fluid of the hybrid chamber 27 and the global spray chamber 26 are recombined via a return manifold 66 and delivered to the heat exchanger. The heat exchanger may be in remote location or part of the chassis 20 and may be either a liquid-to-air, or liquid-to-liquid style.

C. Chassis (Global Spray Chamber and Hybrid Chamber)

As shown in FIGS. 2 through 10 and 13 of the drawings, the chassis 20 may have various shapes, structures and configurations. The chassis 20 illustrated in the drawings should not be interpreted to limit the scope of protection of the present invention. Chassis 20 may be freestanding or mounted into a rigid structure, such as but not limited to a network rack.

Figure 3:
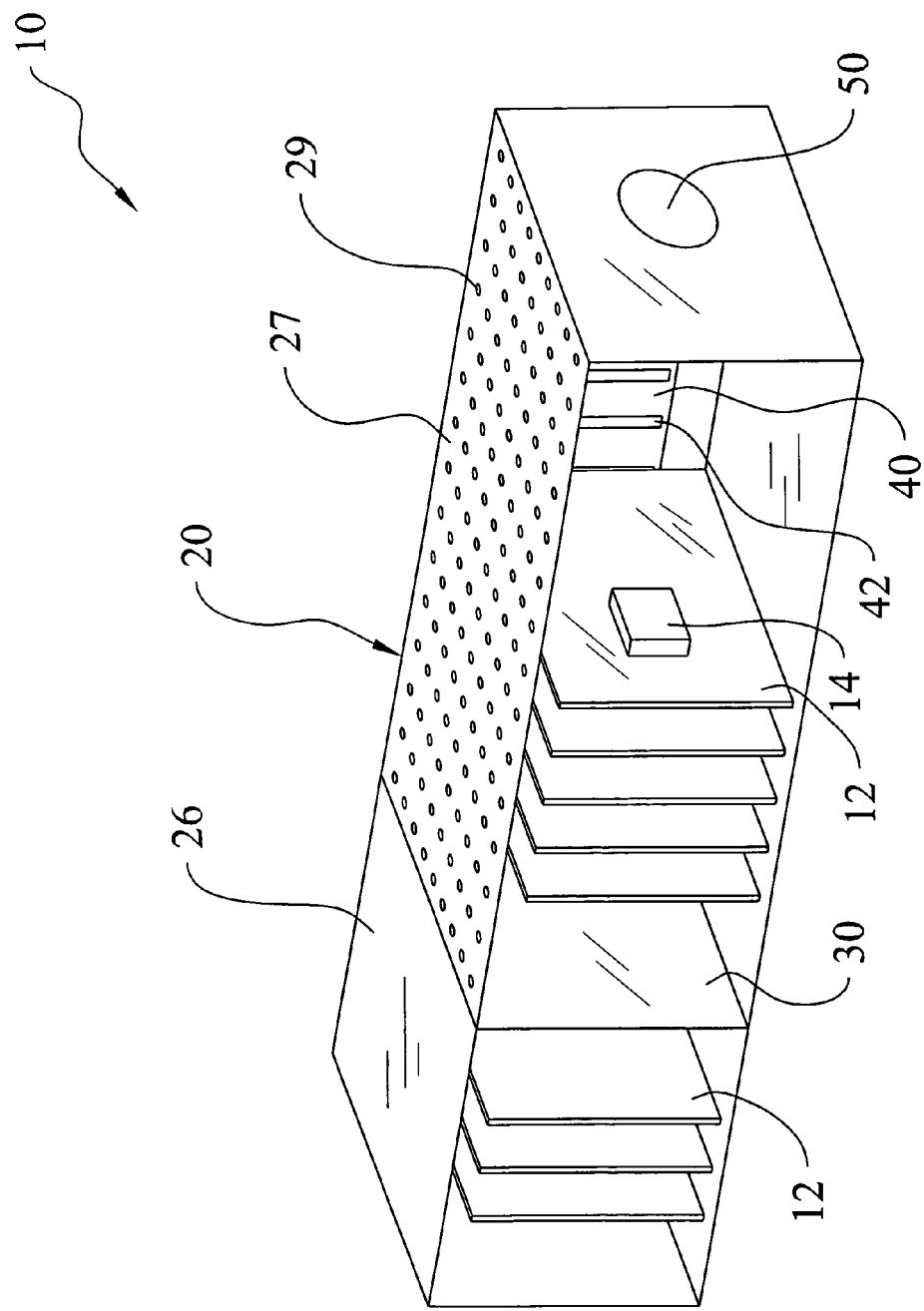
FIG. 3 is a front perspective view of the present invention.
Figure 4:
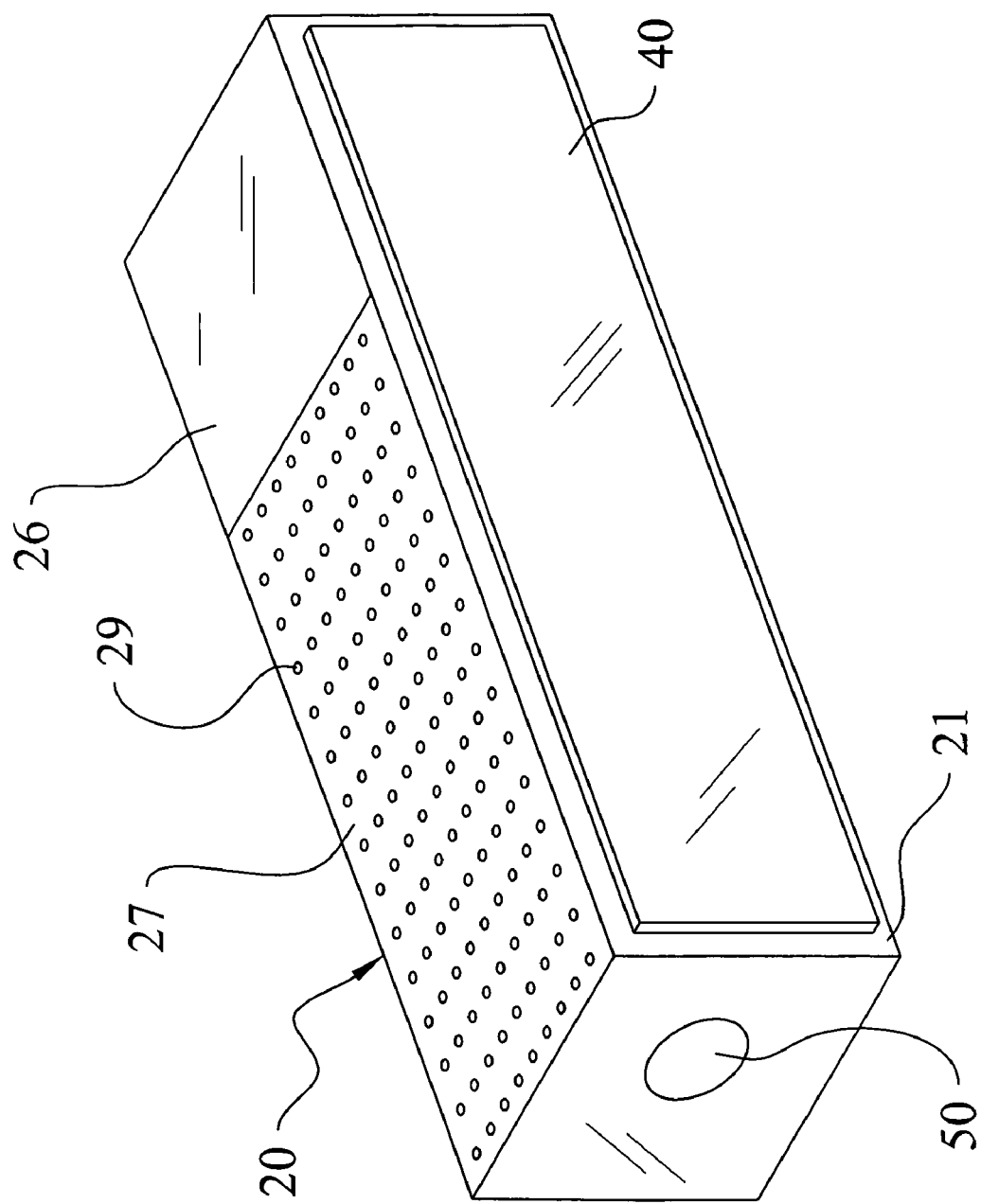
FIG. 4 is a rear perspective view of the present invention illustrating the common backplane.

More particularly, the chassis 20 preferably has at least one hybrid chamber 27, and at least one global spray chamber 26 as shown in FIGS. 3 through 8 of the drawings. The chambers 26, 27 may be organized in various configurations other than illustrated in the figures. The global spray chamber 26 and hybrid chamber 27 may be separated within the chassis 20 by a divider wall 30 as shown in FIGS. 2 and 3 of the drawings. In addition, a dry chamber 28 where solely air cooling occurs may be attached to the chassis 20 for thermally managing low heat flux components. The hybrid chamber 27 is not limited to a closed structure as shown, and can be any structure that provides support to one or more cards (ie. a frame).

The global spray chamber 26 and hybrid chamber 27 also are preferably enclosed by access doors/panels (not shown) as are well known in the art. The access door/panel connected to the global spray chamber 26 preferably is sealed to the global spray chamber 26 to prevent coolant loss. It can be appreciated that the access doors/panels for the global spray chamber 26 and the hybrid chamber 27 may be connected to one another or comprised of a single structure.

Figure 7:
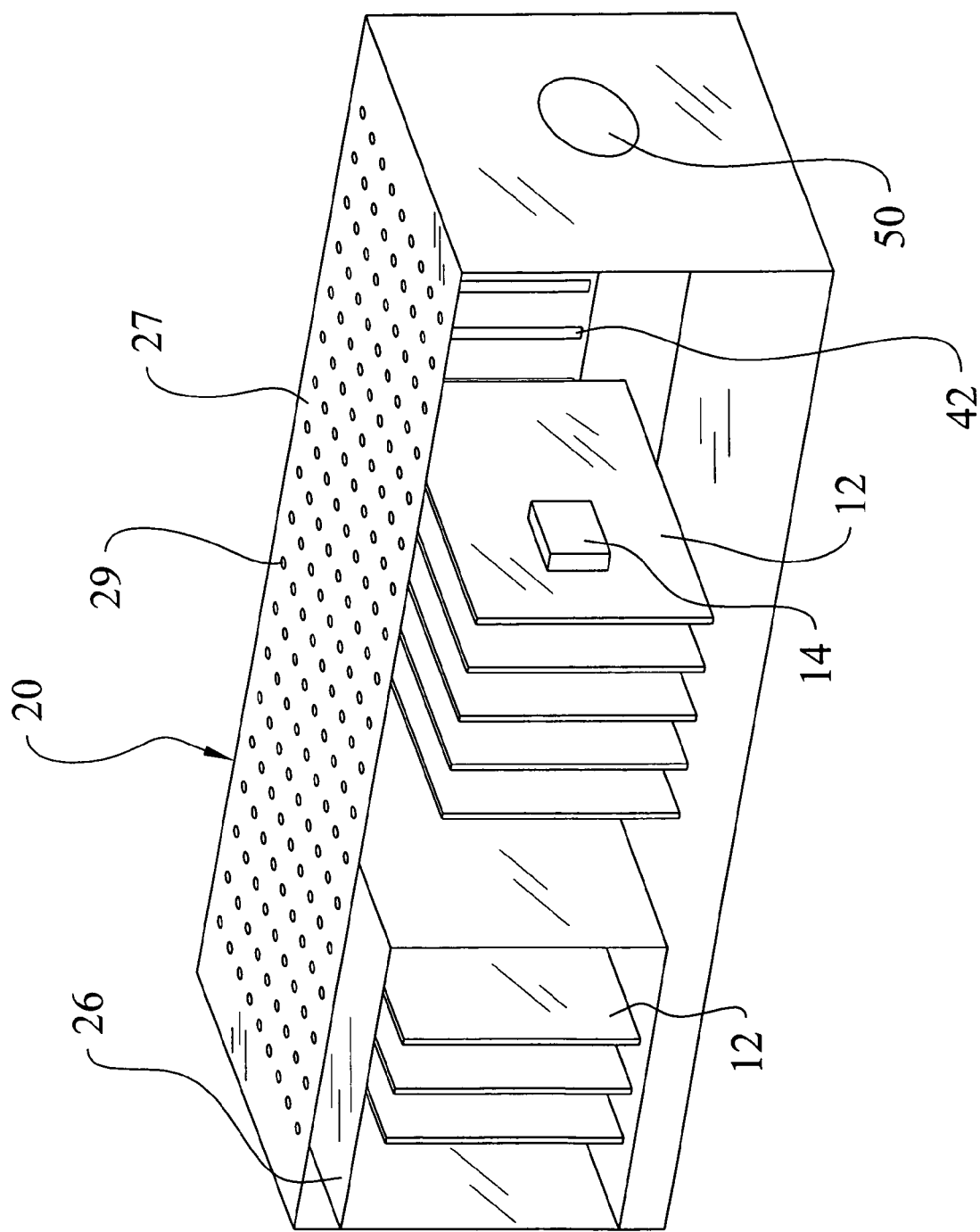
FIG. 7 is a front perspective view illustrating an alternative variation of the global spray chamber.
Figure 8:
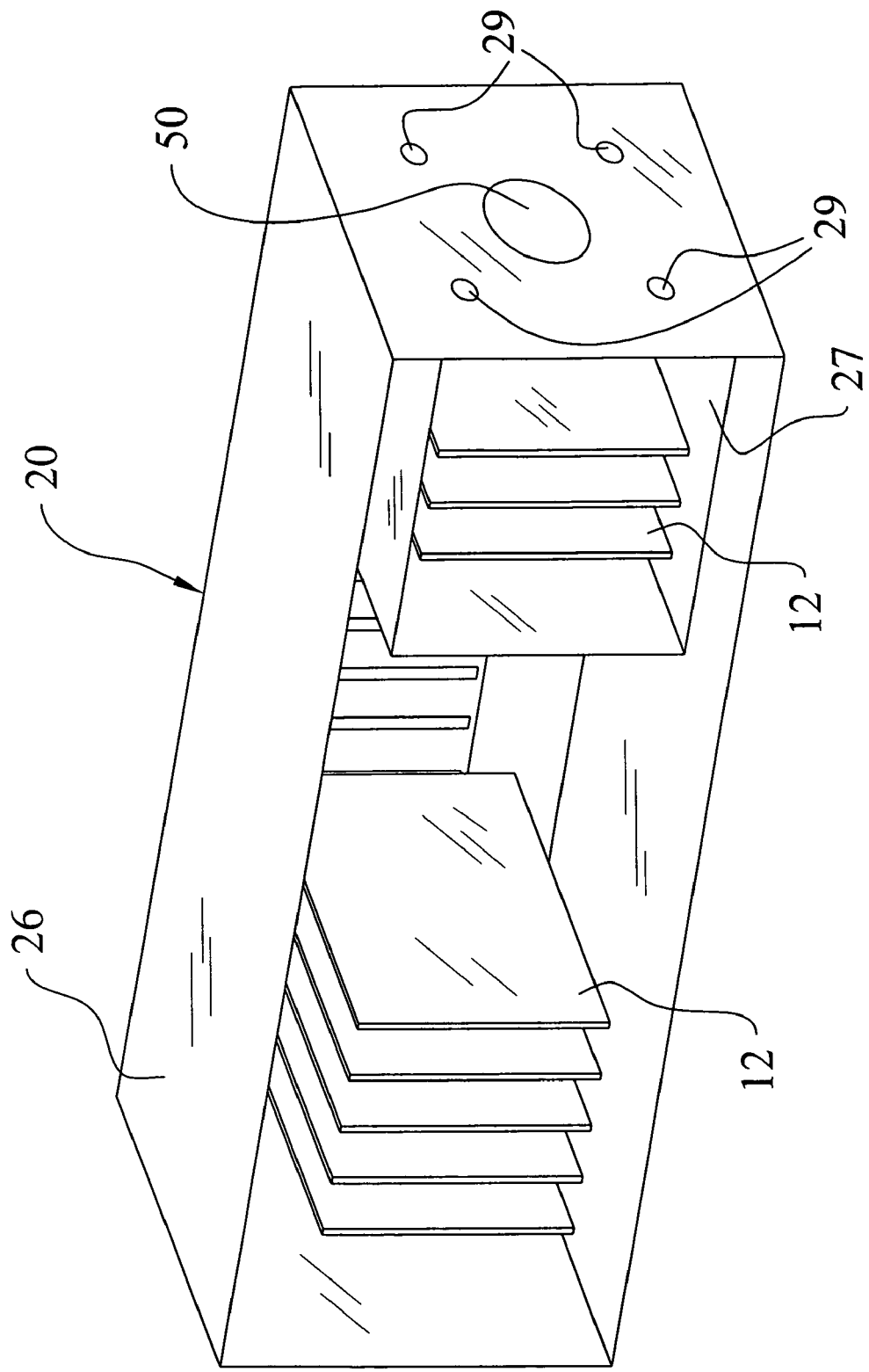
FIG. 8 is a front perspective view illustrating an alternative variation of the hybrid chamber.
Figure 9:
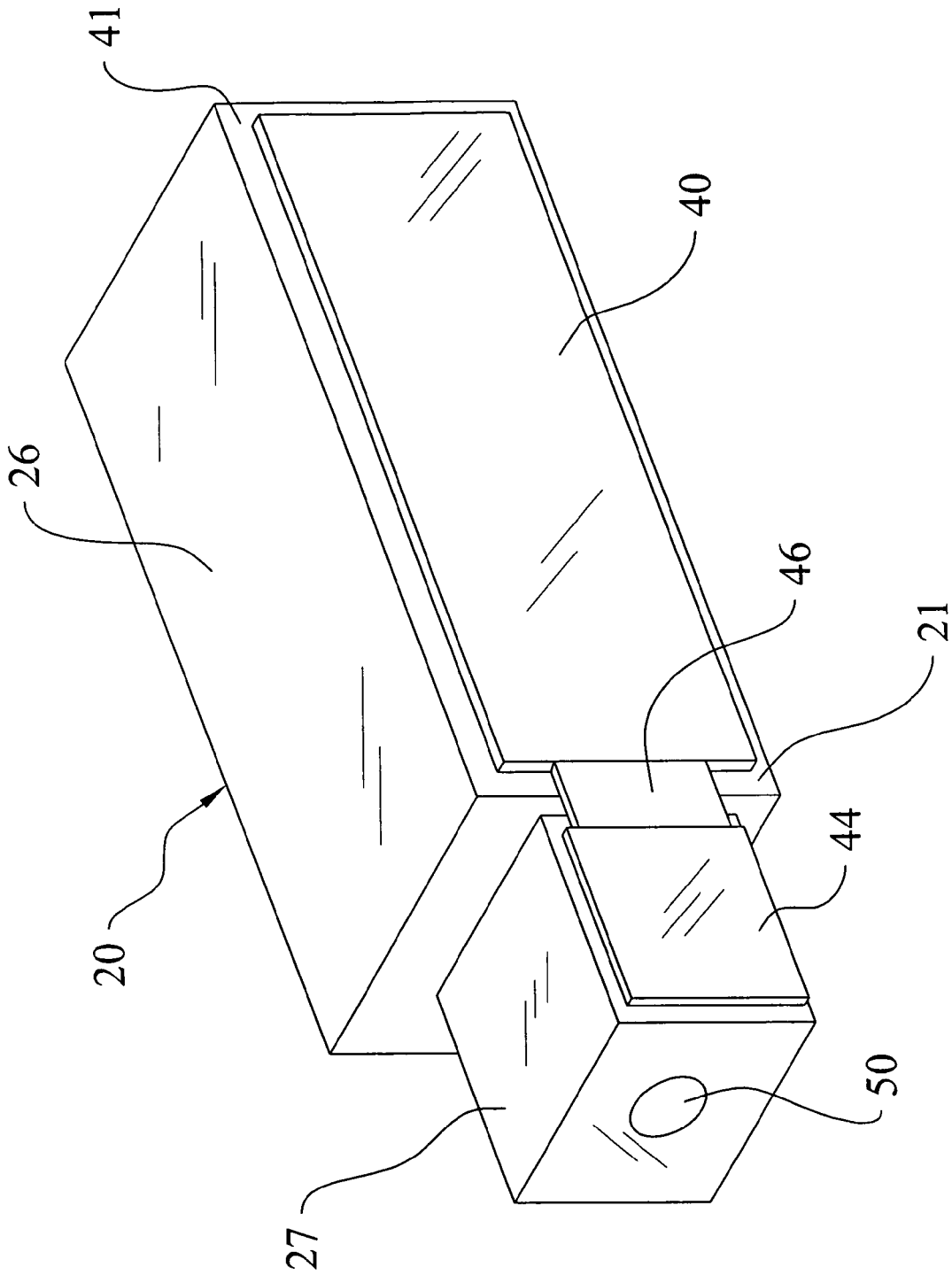
FIG. 9 is a rear perspective view of an alternative variation of the dry chamber.
Figure 13:
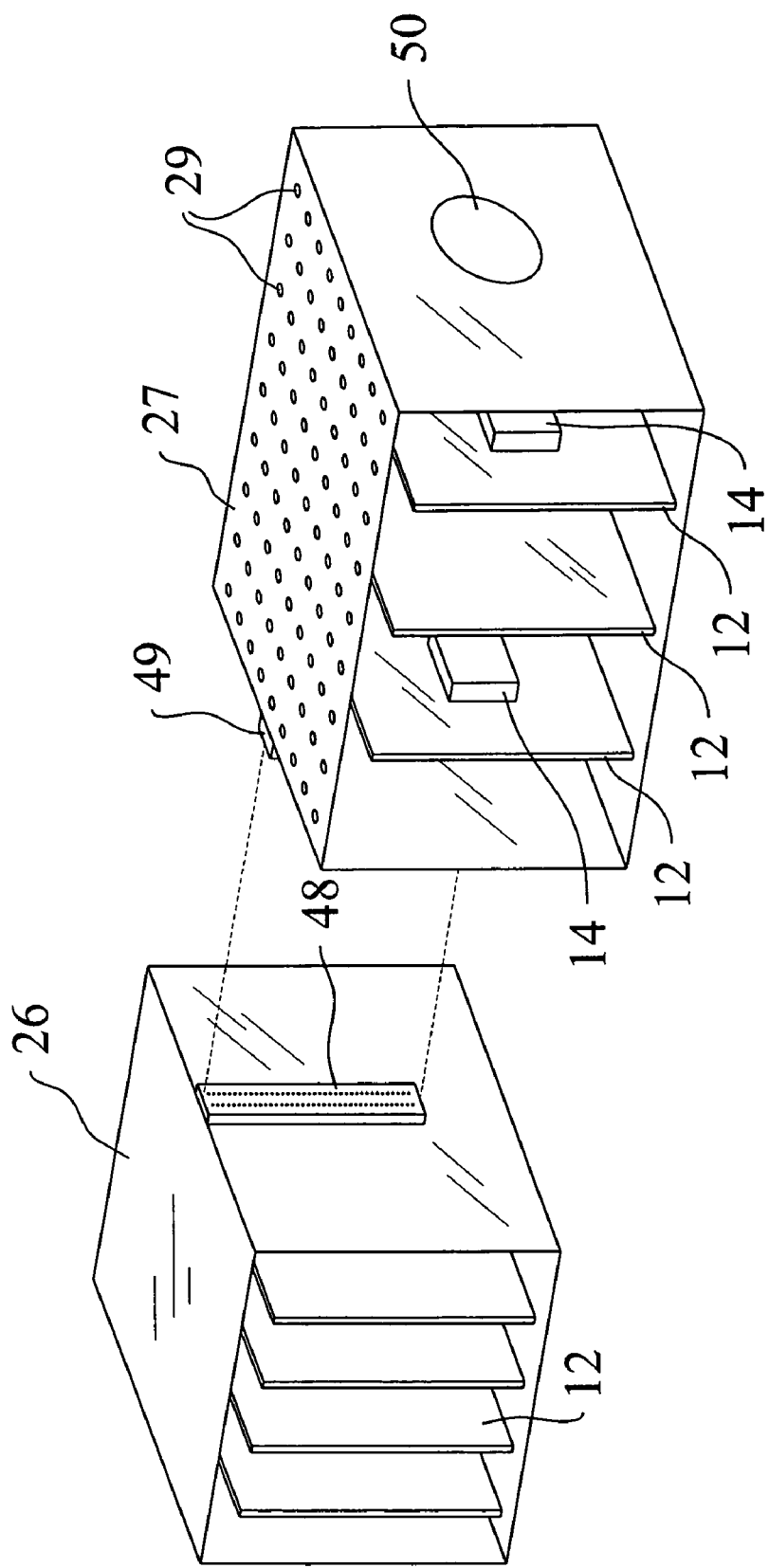
FIG. 13 is an upper perspective view of an alternative embodiment illustrating the backplane positioned within the global spray chamber and electrically connected to a sealed connector for connecting to a hybrid connector of the hybrid chamber.

The hybrid chamber 27 and the global spray chamber 26 may be positioned within an overall structure as separate compartments (see FIGS. 7 and 8) or attached to one another (see FIGS. 9 and 13). The hybrid chamber 27 may be positioned relative to global spray chamber 26 in a side-to-side, top-to-bottom, or back-to-back fashion. In a back-to-back arrangement backplane 40 may have connectors on both of its sides, or be an assembly of two or more individual backplane boards. FIG. 7 illustrates the hybrid chamber 27 completely or partially surrounding the global spray chamber 26. FIG. 8 illustrates the global spray chamber 26 completely or partially surrounding the hybrid chamber 27. FIG. 9 illustrates a hybrid chamber 27 attached to the global spray chamber 26 utilizing conventional fasteners thereby allowing "swapping" of the hybrid chamber 27 or the global spray chamber 26 with a new chamber 26, 28.

The global spray chamber 26 is designed to allow for liquid coolant to contact the cards 12 thereby conducting the thermal energy generated by the wet cards 12 (i.e. global cooling). Various well-known liquid coolant thermal management technologies may be utilized within the global spray chamber 26 for thermally managing the wet cards 12 within the global spray chamber 26. The cards 12 positioned within the global spray chamber 26 must be capable of being positioned within a dielectric coolant.

For example, a spray unit 60 is preferably positioned within the global spray chamber 26 and fluidly connected to a pump unit 62. The pump unit 62 fluidly receives used coolant from within the global spray chamber 26 and preferably thermally conditions the coolant through a heat exchanger prior to transmission to the spray unit 60. U.S. Pat. Nos. 5,220,804 and 6,108,201 illustrate spray cooling technology that may be utilized within the present invention and are hereby incorporated by reference into this application. Also incorporated by this reference is U.S. Pat. No. 5,907,473 for a global spray chamber having a card cage supporting a plurality of cards.

The global spray chamber 26 is designed to receive at least one electronics card 12 capable of being spray cooled. The "wet cards" 12 are preferably: high heat flux cards 12 that generate a significant amount of heat during operation thereof; have complex geometries not ideally suited for zone cooling; or have wide area heat fluxes that are optimally cooled via global methods.

Figure 10:
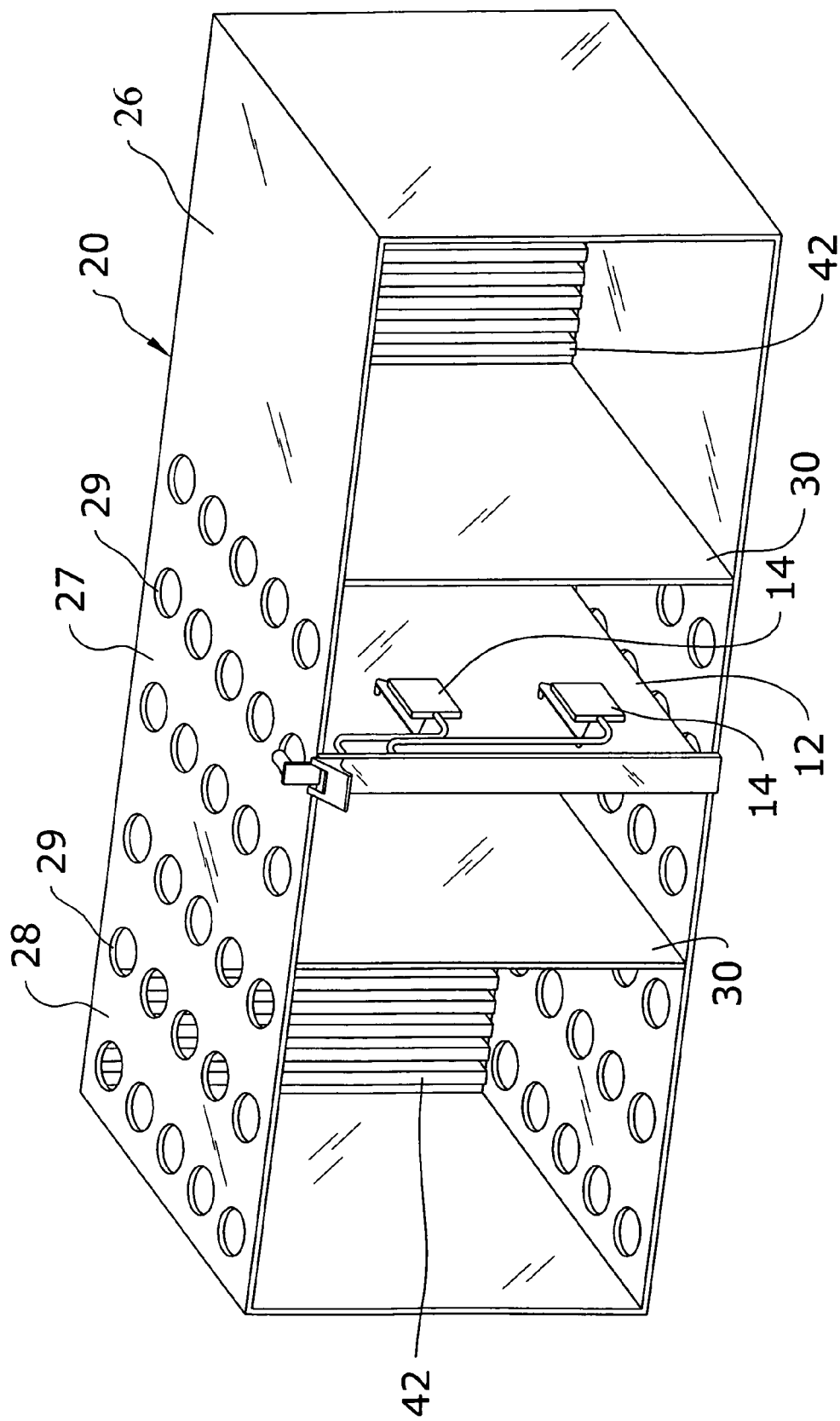
FIG. 10 is an upper perspective view of another alternative variation of the present invention containing three sections (global spray chamber, hybrid chamber and dry chamber).
Figure 11:
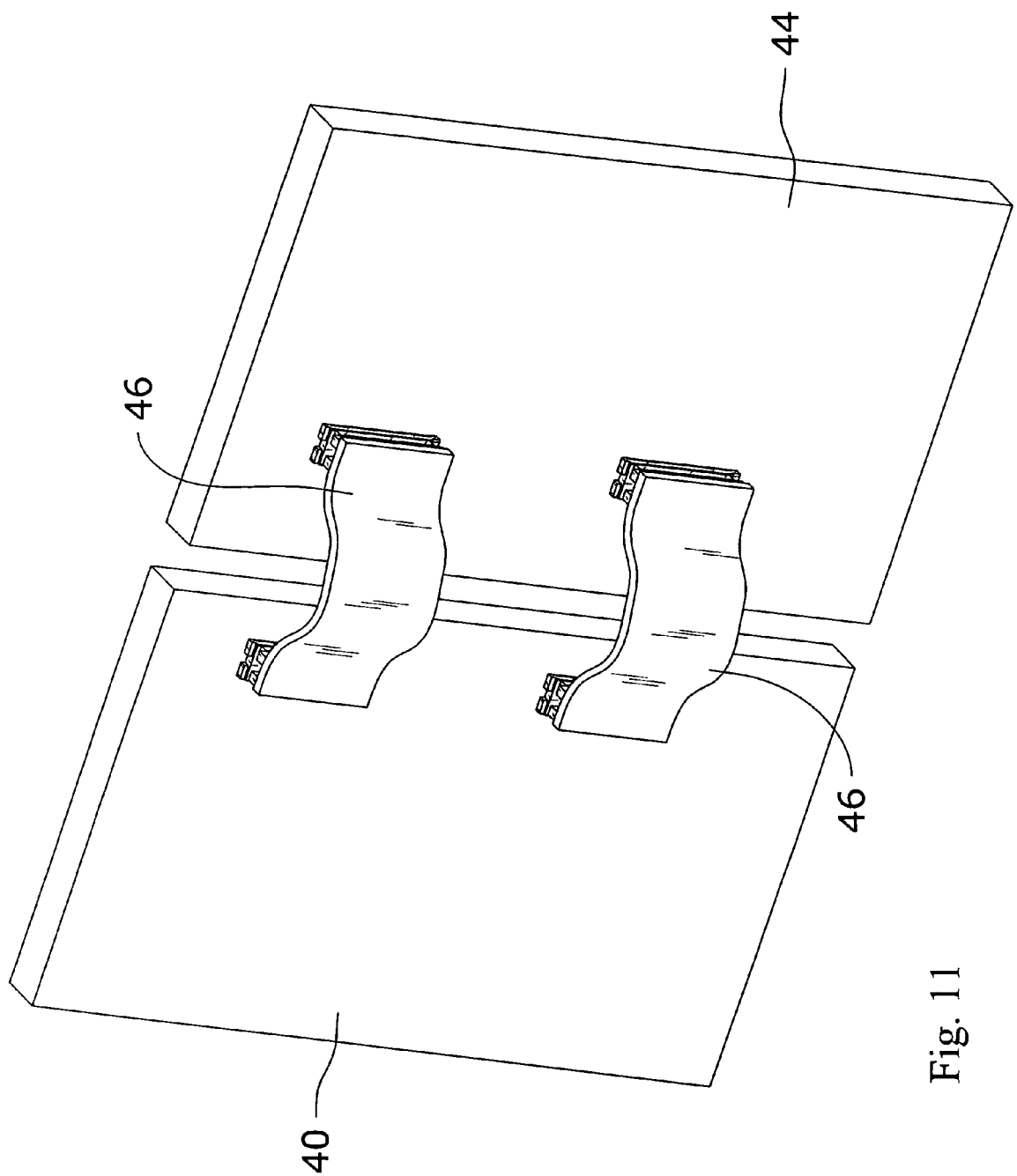
FIG. 11 is a rear upper perspective view of a flex circuit interconnect for connecting two backplanes together of the present invention.

The hybrid chamber 27 is designed to receive at least one electronics card 12 capable of being dry/air cooled along with local cooling (a.k.a. zone cooling) of a few high heat flux components on the cards 12 with one or more zone coolers 14. The hybrid chamber 27 may be designed to include vents 29 for allowing air cooling of the cards 12 and components as shown in FIG. 10 of the drawings. The hybrid chamber 27 may also be a open structural frame which provides large amount of air flow and does not need vents 29. The zone coolers 14 may be comprised of spray cooling zone coolers, spray cooled cold plates, liquid cold plates and the like.

The usage of zone coolers 14 for cooling individual heat producing components that have high heat fluxes allows for the other components with lower heat fluxes to be dry/air cooled thereby reducing the overall complexity and cost of the cooling system. Zone cooling of individual components in the hybrid chamber 27 also allows for easy access to the cards 12 compared to global spray cooling. It can be appreciated that coolant used for the global spray chamber 26 may also be used for the zone coolers 14 or a separate pump may be used for the zone coolers 14. Alternatively, a dedicated spray system may be utilized that is devoted solely to the zone coolers 14.

The dry chamber 28 and the hybrid chamber 27 are may be designed to allow for airflow to pass through and make contact with the dry cards 12 within the dry chamber 28. Various well-known dry cooling technologies may be utilized to pass air through the dry chamber 28. For example, a fan 50 may be fluidly connected to the dry chamber 28 as shown in FIGS. 2 through 9 of the drawings. Depending upon desired configuration flexibility, cost, quantity of dry cards being used, the dry chamber 28 provides the means of reducing the overall assembly cost by not having the fluid manifolding and the such of the hybrid chamber 27.

In addition, the dry chamber 28 preferably includes a plurality of vents 29 within the walls, floor and ceiling of the dry chamber 28 allowing for the free flow of air thereby maintaining a desired temperature of the electronic cards 12 within the dry chamber 28.

The dry chamber 28 is designed to receive at least one electronics card 12 capable of being dry/air cooled. The "dry cards" 12 are preferably low-medium heat flux cards 12 that generate relatively lower amounts of heat during operation thereof compared to the wet cards 12. Dry cards 12 are generally less expensive because they do not require operation within a liquid coolant.

D. Backplane

Figure 5:
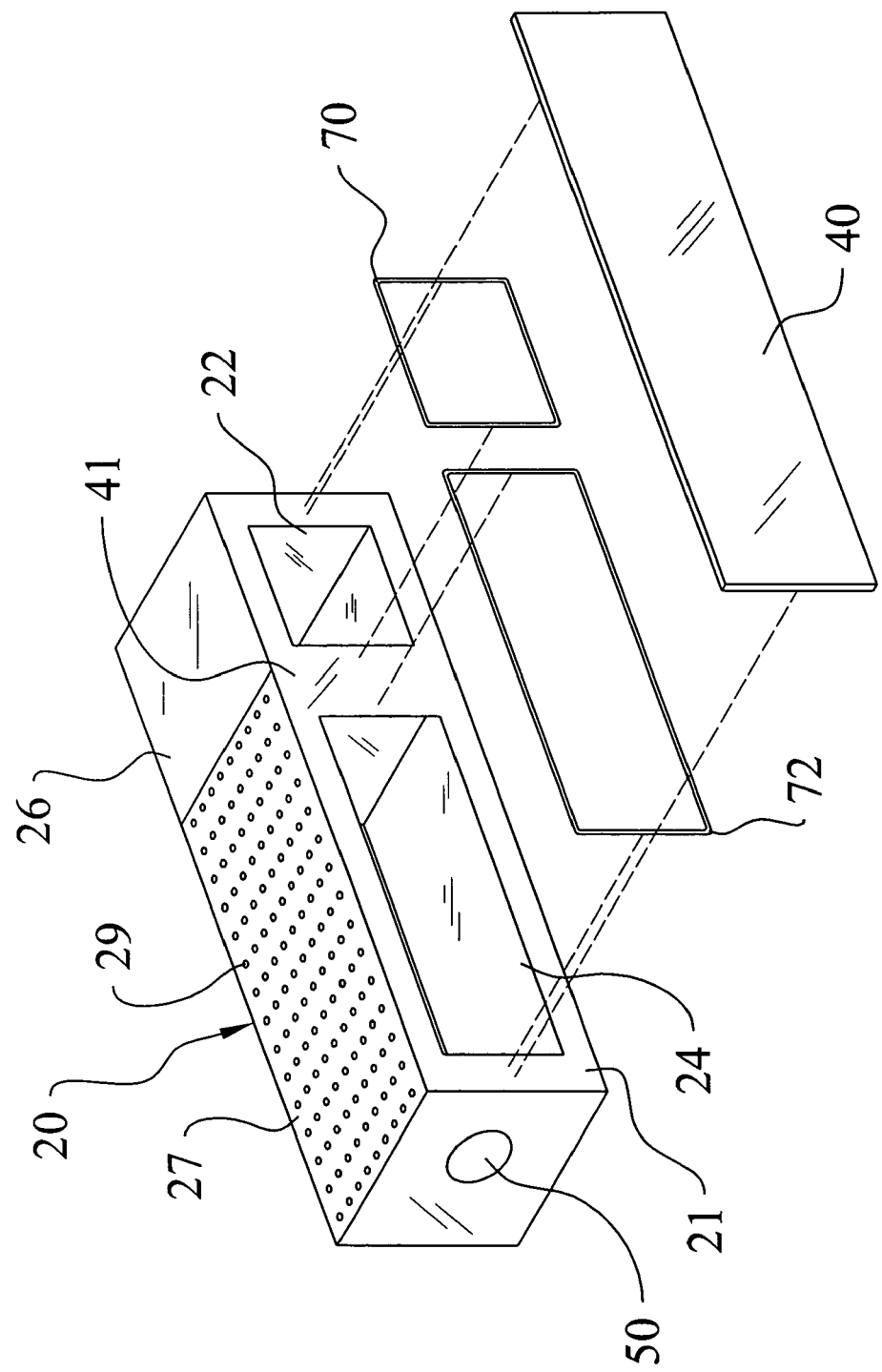
FIG. 5 is an exploded rear perspective view of the present invention illustrating the seals.

As shown in FIGS. 2 and 5 of the drawings, a first opening 22 is positioned within a rear portion 21 of the chassis 20 extending into the global spray chamber 26. As further shown in FIGS. 2 and 5 of the drawings, a second opening 24 is positioned within the rear portion 21 of the chassis 20 extending into the hybrid chamber 27 (a third opening may also be used to provide access into the dry chamber 28).

The first opening 22 and the second opening 24 may have various shapes, sizes and locations within the chassis 20. However, the first opening 22 and the second opening 24 are preferably sized sufficiently to accommodate the sockets 42 attached to the backplane 40 and/or the secondary backplane 44 as best illustrated in FIG. 2 of the drawings.

The backplane 40 is attached to the rear portion 21 of the chassis 20 by various attachment means such as fasteners, adhesive, sealants, brackets, clamps and the like. The backplane 40 is preferably sealed about the first opening 22 and the second opening 24 to prevent coolant from escaping from the global spray chamber 26. It can be appreciated that only the global spray chamber 26 may be sealed by the backplane 40 since airflow through the second opening 24 will not interfere with the thermal management of the dry cards 12.

The backplane 40 has at least one dry socket extending into the hybrid chamber 27 and at least one wet socket extending into the global spray chamber 26 as shown in FIG. 2 of the drawings. The sockets 42 may be comprised of any electronic receptacle capable of electrically receiving a card 12.

Alternatively, the backplane 40 may be completely enclosed in the global spray chamber 27 and connected to a sealed connector 48 as shown in FIG. 13 of the drawings. The sealed connector 48 is electrically connectable to a hybrid connector 49 that is electrically connected to the secondary backplane 44. The secondary backplane 44 may be positioned within or outside of the hybrid chamber 27. The hybrid connector 49 may be sealed to the hybrid chamber 27 even though it is not required to be sealed.

E. Seal

As shown in FIG. 5 of the drawings, at least one seal is positioned between the rear portion 21 of the chassis 20 and the backplane 40 for sealing about the first opening 22 and the second opening 24. The seal may be comprised of a single structure or a plurality of seal structures.

FIG. 5 illustrates a first seal 70 surrounding the first opening 22 and a second seal 72 surrounding the second opening 24. The first seal 70 and the second seal 72 may be comprised of various structures and materials commonly utilized to construct seals. It can be appreciated that only the first seal 70 is required to operate the present invention by sealing the global spray chamber 26. The seal 70, 72 may also be formed utilizing various other materials/structures such as but not limited to sealants, resins, adhesives, gaskets, O-rings and the like.

F. Secondary Backplane

Figure 6:
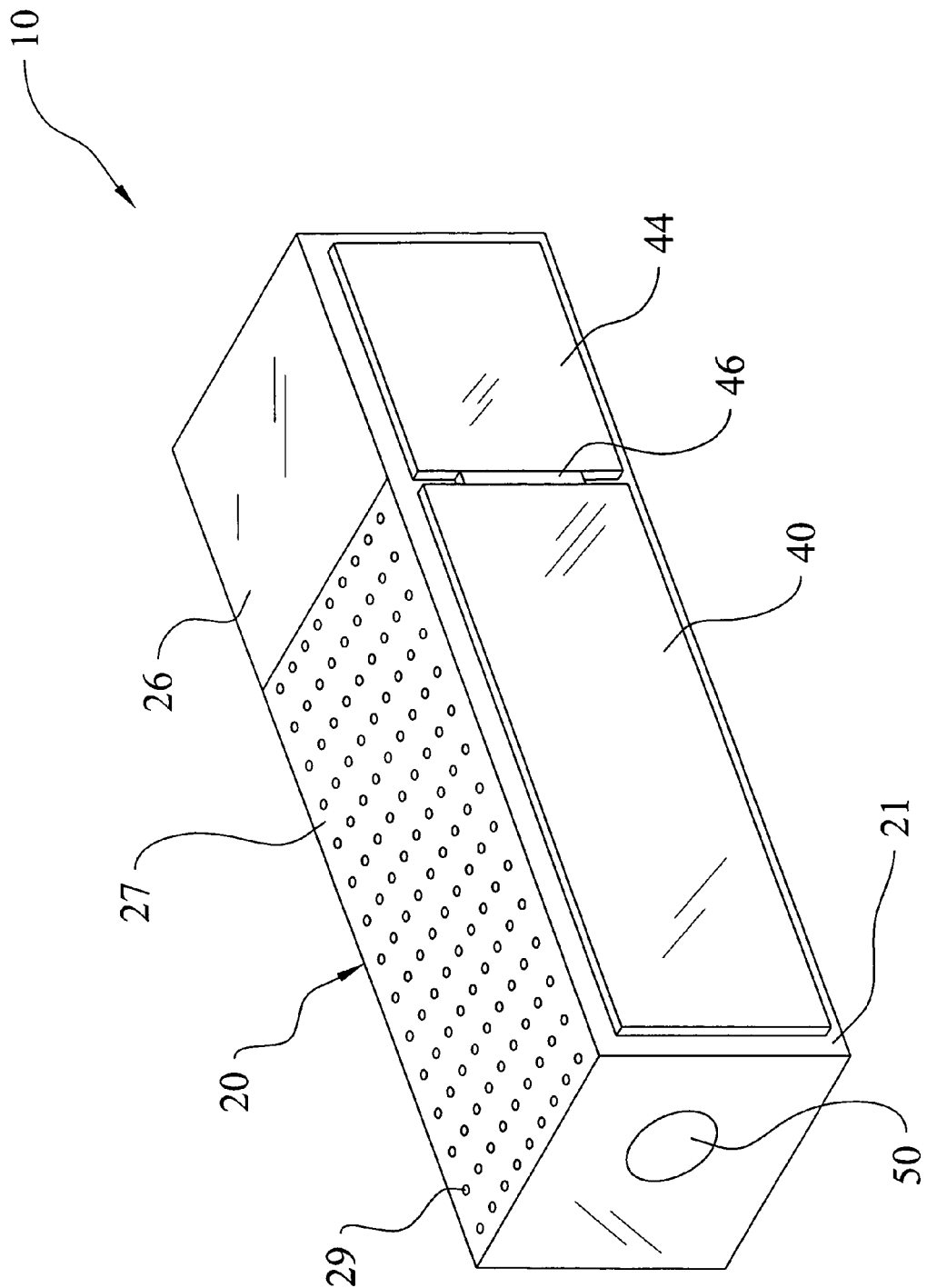
FIG. 6 is a rear perspective view of the present invention utilizing a secondary backplane connected to the backplane.

In addition to a backplane 40, a secondary backplane 44 may be attached and electrically connected to the backplane 40 as shown in FIGS. 6 and 9 of the drawings. The backplane 40 preferably has at lease one dry socket extending into the hybrid chamber 27 and the secondary backplane 44 has at least one wet socket extending into the global spray chamber 26.

Figure 12:
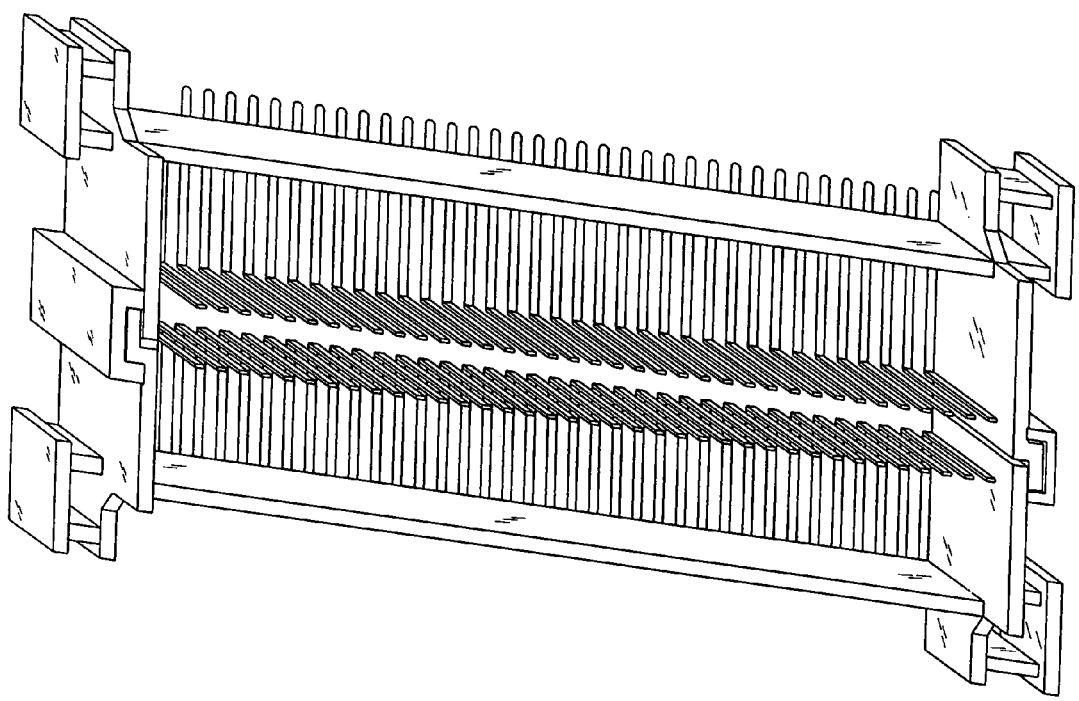
FIG. 12 is a rear upper perspective view of a board-to-board interconnect for connecting two backplanes together of the present invention.

A connector member 46 is electrically positioned between the backplane 40 and the secondary backplane 44 as further shown in FIGS. 6 and 9 of the drawings. The connector member 46 may be comprised of various electrical connectors such as a direct connector (FIG. 6), a flex circuit interconnect (FIG. 11) or a board-to-board interconnect (FIG. 12). The secondary backplane 44 and the backplane 40 are preferably sealed to the rear portion 21 of the chassis 20 about the first opening 22 and the second opening 24 respectively.

G. Operation

In operation of the present invention, at least one high heat flux card 12 is positioned within the global spray chamber 26 and electrically connected within one of the sockets 42 attached to the backplane 40 as shown in FIGS. 2 and 3 of the drawings. The global spray chamber 26 is then sealed by closing one or more access door/panels upon the global spray chamber 26.

At least one card 12 with one or more high heat flux components is positioned within the hybrid chamber 27 and electrically connected within one of the sockets 42 attached to the backplane 40 as shown in FIG. 10 of the drawings. The zone coolers 14 are thermally connected to the high heat flux components of the card 12 either prior to or after installation of the card 12 into the hybrid chamber 27. One or more access door/panels may then be closed upon the hybrid chamber 27.

If a dry chamber 28 is used, at least one dry card 12 is positioned within the dry chamber 28 and electrically connected within one of the sockets 42 attached to the backplane 40 as shown in FIG. 10 of the drawings. One or more access door/panels may then be closed upon the dry chamber 28.

The electronic cards 12 may then be electrically operated as desired to perform a desired task. Before, during and/or after operation of the electronic cards 12, a liquid coolant is applied to the wet cards 12 within the global spray chamber 26 for thermally managing the wet cards 12. Various sensors within the global spray chamber 26 determine the coolant flow rate and coolant temperature applied to the wet cards 12 depending upon the heat flux of the wet cards 12 and the desired temperature of the wet cards 12.

Before, during and/or after operation of the electronic cards 12, a liquid coolant is provided to the zone coolers 14 coupled to the hybrid cards 12 within the hybrid chamber 27 for zone cooling specific high heat flux components on the hybrid cards 12. Various sensors determine the coolant flow rate and coolant temperature provided to the zone coolers 14 depending upon the heat flux of the individual high heat flux components and the desired temperature of the individual high heat flux components.

In addition to operation of the spray cooling system within the global spray chamber 26 and the hybrid chamber 27, airflow may be applied within the hybrid chamber 27 (and the dry chamber 28 if used) for thermally managing the cards 12 within thereof. A fan 50 or similar air movement device may be utilized to cause air to flow through the hybrid chamber 27 thereby thermally managing the dry portions of the electronic cards 12. Various sensors within the hybrid chamber 27 determine the amount of airflow required to maintain a desired temperature within the dry portions of the cards 12.

If the user requires access to the cards 12 within the hybrid chamber 27, the access door/panel is simply removed without having to disturb the global spray chamber 26. The user is then able to make the required additions/repairs within the hybrid chamber 27 (or dry chamber 28) and close the same in an efficient manner without losing any coolant. If the user requires access to the cards 12 within the global spray chamber 26, the corresponding access door/panel is then removed. A small volume of liquid coolant may be lost in opening the global spray chamber 26, but the amount of coolant loss is less than if a larger global spray chamber 26 were opened. The user is then able to make the required additions/repairs within the global spray chamber 26 and close the same in an efficient manner without losing significant amounts of coolant.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed to be within the expertise of those skilled in the art, and all equivalent structural variations and relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

We claim:

1. A hybrid thermal management system, comprising:
   a chassis including a global spray chamber and a hybrid chamber, at least one wet electronic card positioned within said global spray chamber and at least one hybrid electronic card positioned within said hybrid chamber;
   wherein said at least one hybrid electronic card is a low-medium heat flux card with reduced cooling requirements that includes at least one high heat flux component and generates relatively lower amounts of heat during operation thereof compared to said at least one wet electronic card;
   at least one spray unit within said global spray chamber for globally spraying liquid coolant to said at least one wet electronic card;
   at least one liquid zone cooler within said hybrid chamber to thermally manage said at least one high heat flux component on said at least one hybrid card; and
   a dry cool system fluidly connected to said hybrid chamber for applying airflow to said at least one hybrid electronic card positioned in said dry chamber.

2. The hybrid thermal management system of claim 1, wherein said hybrid chamber includes a fan for forcing air over at least one card.

3. The hybrid thermal management system of claim 1, including:
   a first opening within a rear portion of said chassis extending into said global spray chamber;
   a second opening within said rear portion of said chassis extending into said hybrid chamber; and
   a backplane attached to said rear portion of said chassis, wherein said backplane has at least one dry socket extending into said hybrid chamber and at least one wet socket extending into said global spray chamber.

4. The hybrid thermal management system of claim 3, wherein said backplane is sealed to said rear portion of said chassis about said first opening and said second opening.

5. The hybrid thermal management system of claim 4, including a seal positioned between said rear portion of said chassis and said backplane.

6. The hybrid thermal management system of claim 5, wherein said seal is comprised of a first seal surrounding said first opening and a second seal surrounding said second opening.

7. The hybrid thermal management system of claim 4, including a sealant positioned between said rear portion of said chassis and said backplane.

8. The hybrid thermal management system of claim 1, wherein said chassis includes a dry chamber.

9. The hybrid thermal management system of claim 1, including a spray cooling management unit fluidly connected to said at least one spray unit and said at least one liquid zone cooler.

10. The hybrid thermal management system of claim 1, including:
    a first opening within a rear portion of said chassis extending into said global spray chamber;
    a second opening within said rear portion of said chassis extending into said hybrid chamber;
    a backplane attached to said rear portion of said chassis, wherein said backplane has at least one dry socket extending into said hybrid chamber; and
    a secondary backplane attached to said rear portion of said chassis and electrically coupled to said backplane, wherein said secondary backplane has at least one wet socket extending into said global spray chamber.

11. The hybrid thermal management system of claim 10, including a connector member electrically positioned between said backplane and said secondary backplane.

12. The hybrid thermal management system of claim 10, wherein said secondary backplane and said backplane are sealed to said rear portion of said chassis about said first opening and said second opening respectively.

13. The hybrid thermal management system of claim 12, including a seal positioned between said rear portion of said chassis and said backplane and said secondary backplane.

14. The hybrid thermal management system of claim 13, wherein said seal is comprised of a single structure.

15. The hybrid thermal management system of claim 13, wherein said seal is comprised of a first seal surrounding said first opening and a second seal surrounding said second opening.

16. The hybrid thermal management system of claim 12, including a sealant positioned between said rear portion of said chassis and said backplane.

17. The hybrid thermal management system of claim 1, wherein said hybrid chamber includes a plurality of vents for allowing air to pass over at least one card.

18. A method of operating a thermal management chassis having a wet chamber, and a hybrid chamber, said method comprising the steps of:
(a) positioning at least one high heat flux card within said wet chamber;
(b) positioning at least one hybrid card within said hybrid chamber, wherein said at least one hybrid card is a low-medium heat flux card with reduced cooling requirements that includes at least one high heat flux component and generates relatively lower amounts of heat during operation thereof compared to said at least one high heat flux card;
(c) applying liquid coolant upon said high heat flux card; and
(d) providing liquid coolant to at least one zone cooler thermally connected to said at least one high heat flux component on said hybrid card;
(e) applying airflow upon said hybrid card.

19. The method of operating a thermal management chassis of claim 18, wherein said high heat flux card, and said hybrid card are electrically connected within sockets of a backplane.

20. A hybrid thermal management system, comprising:
a chassis including a global spray chamber and a hybrid structure, at least one wet electronic card positioned within said global spray chamber and at least one hybrid electronic card positioned within said hybrid structure;
wherein said at least one hybrid electronic card is a low-medium heat flux card with reduced cooling requirements that includes at least one high heat flux component and generates relatively lower amounts of heat during operation thereof compared to said at least one wet electronic card;
at least one spray unit within said global spray chamber for globally spraying liquid coolant at least one wet card;
at least one liquid zone cooler within said hybrid structure capable of zone cooling said at least one high heat flux component on at least one hybrid card; and
a dry cool system fluidly connected to said hybrid chamber for applying airflow to said at least one hybrid electronic card positioned in said dry chamber.

21. The hybrid thermal management system of claim 20, wherein said hybrid card is a hard drive.

22. The hybrid thermal management system of claim 21, wherein said hybrid card is a flash drive.

23. The hybrid thermal management system of claim 20, wherein said hybrid card is a I/O card.

* * * * *